(12) United States Patent
Huynh et al.

(10) Patent No.: US 11,195,787 B2
(45) Date of Patent: Dec. 7, 2021

(54) SEMICONDUCTOR DEVICE INCLUDING AN ANTENNA

(71) Applicant: Infineon Technologies AG, Neubiberg (DE)

(72) Inventors: Ngoc-Hoa Huynh, Forstinning (DE); Franz-Xaver Muehlbauer, Rimbach (DE); Claus Waechter, Sinzing (DE); Veronika Huber, Bad Abbach (DE); Dominic Maier, Pleystein (DE); Thomas Kilger, Regenstauf (DE); Saverio Trotta, Munich (DE); Ashutosh Baheti, Munich (DE); Georg Meyer-Berg, Munich (DE); Maciej Wojnowski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/045,687

(22) Filed: Feb. 17, 2016

(65) Prior Publication Data

US 2017/0236776 A1  Aug. 17, 2017

(51) Int. Cl.
| | |
|---|---|
| *H01L 23/31* | (2006.01) |
| *H01L 23/498* | (2006.01) |
| *H01L 23/367* | (2006.01) |
| *H01L 23/538* | (2006.01) |
| *H01Q 9/28* | (2006.01) |
| *H01Q 1/22* | (2006.01) |
| *H01Q 9/04* | (2006.01) |
| *H01Q 21/06* | (2006.01) |

(Continued)

(52) U.S. Cl.
CPC ........ *H01L 23/49822* (2013.01); *H01L 21/56* (2013.01); *H01L 23/3114* (2013.01); *H01L 23/3672* (2013.01); *H01L 23/3677* (2013.01); *H01L 23/5389* (2013.01); *H01Q 1/2283* (2013.01); *H01Q 9/0407* (2013.01); *H01Q 9/285* (2013.01); *H01Q 21/061* (2013.01); *H01Q 21/065* (2013.01); *H01L 23/49816* (2013.01); *H01L 2223/6677* (2013.01); *H01L 2223/6683* (2013.01); *H01L 2224/04105* (2013.01); *H01L 2224/12105* (2013.01); *H01L 2224/73267* (2013.01); *H01L 2924/18162* (2013.01); *H01Q 9/265* (2013.01)

(58) Field of Classification Search
CPC ................................. H01L 2223/6677
USPC ....................................................... 257/428
See application file for complete search history.

(56) References Cited

U.S. PATENT DOCUMENTS

| | | |
|---|---|---|
| 9,172,131 B2 | 10/2015 | Chen et al. |
| 10,319,688 B2 | 6/2019 | Wolter et al. |
| 2009/0322643 A1 | 12/2009 | Choudhury |

(Continued)

FOREIGN PATENT DOCUMENTS

| | | |
|---|---|---|
| CN | 102324416 | 1/2012 |
| CN | 204732450 | 10/2015 |

*Primary Examiner* — Hsin Yi Hsieh
(74) *Attorney, Agent, or Firm* — Dicke, Billig & Czaja, PLLC

(57) ABSTRACT

A semiconductor device includes a semiconductor chip and a redistribution layer on a first side of the semiconductor chip. The redistribution layer is electrically coupled to the semiconductor chip. The semiconductor device includes a dielectric layer and an antenna on the dielectric layer. The dielectric layer is between the antenna and the semiconductor chip.

12 Claims, 9 Drawing Sheets

(51) Int. Cl.
*H01L 21/56* (2006.01)
*H01Q 9/26* (2006.01)

(56) References Cited

U.S. PATENT DOCUMENTS

| | | |
|---|---|---|
| 2010/0193935 A1 | 8/2010 | Lachner et al. |
| 2012/0062439 A1* | 3/2012 | Liao ............... H01Q 1/526 |
| | | 343/841 |
| 2013/0093067 A1 | 4/2013 | Clark et al. |
| 2013/0292808 A1 | 11/2013 | Yen et al. |
| 2014/0110841 A1 | 4/2014 | Beer et al. |
| 2014/0168014 A1 | 6/2014 | Chih et al. |
| 2014/0307394 A1* | 10/2014 | Lobianco ............ H05K 1/0218 |
| | | 361/728 |
| 2015/0084194 A1* | 3/2015 | Molzer ................ H01L 23/481 |
| | | 257/741 |
| 2015/0194388 A1 | 7/2015 | Pabst et al. |
| 2015/0340765 A1 | 11/2015 | Dang et al. |
| 2016/0178730 A1* | 6/2016 | Trotta .................. G01S 7/006 |
| | | 342/175 |

* cited by examiner

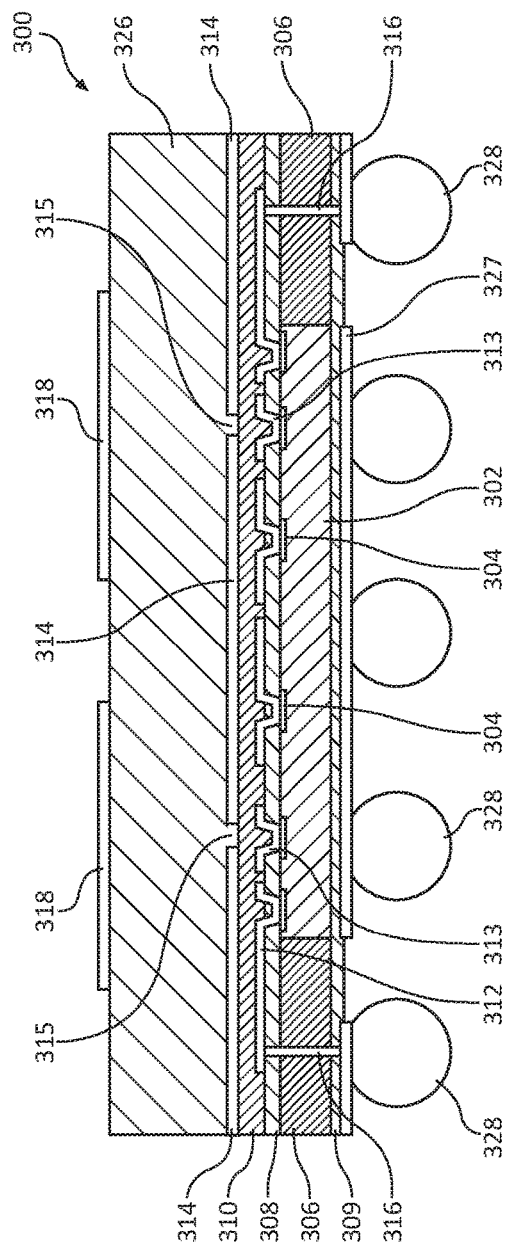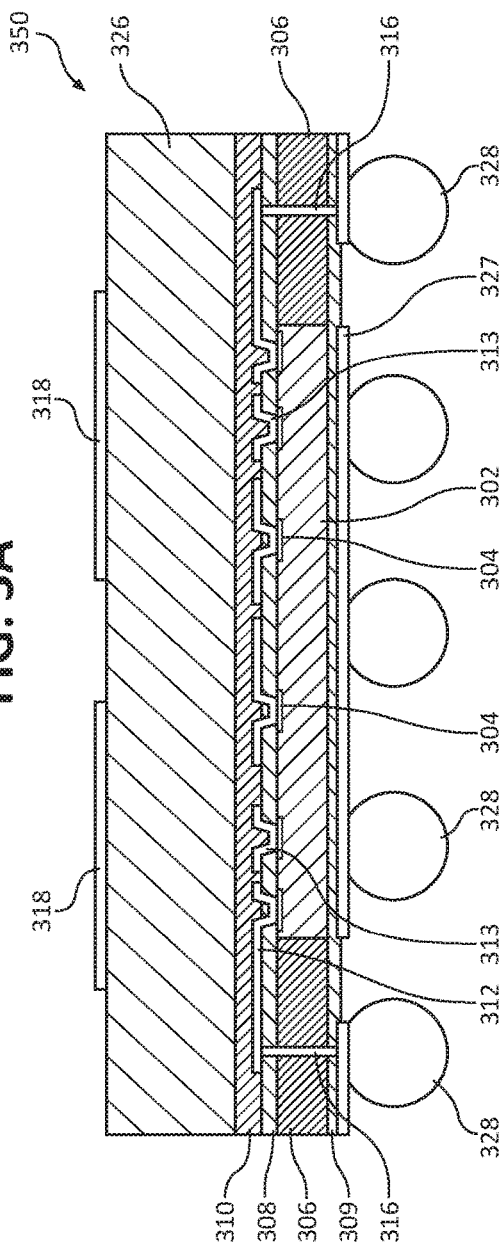

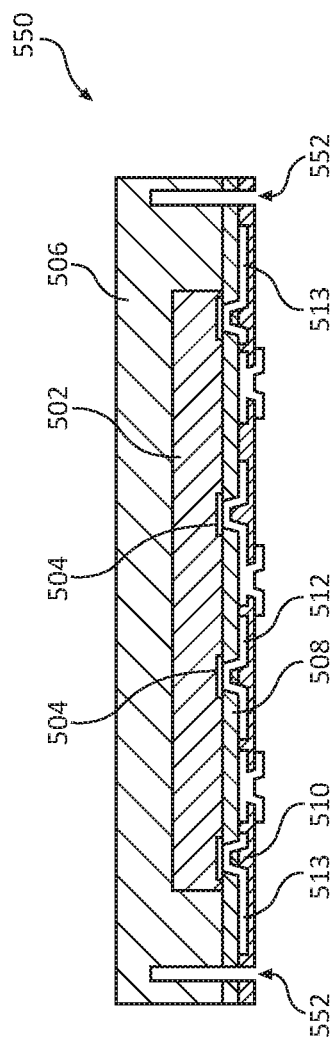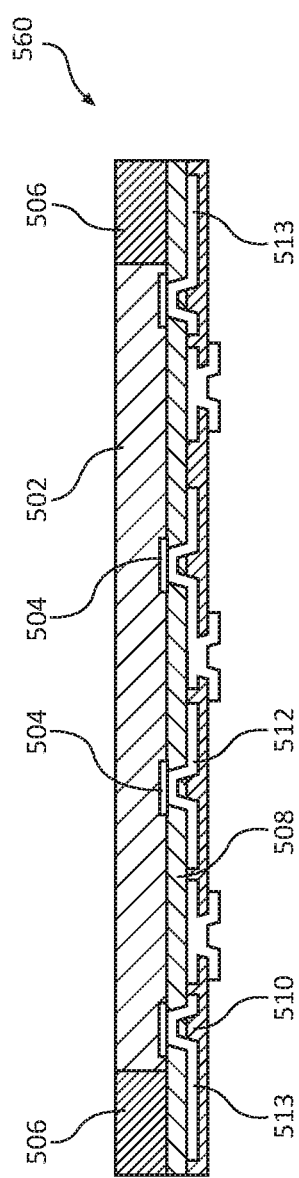

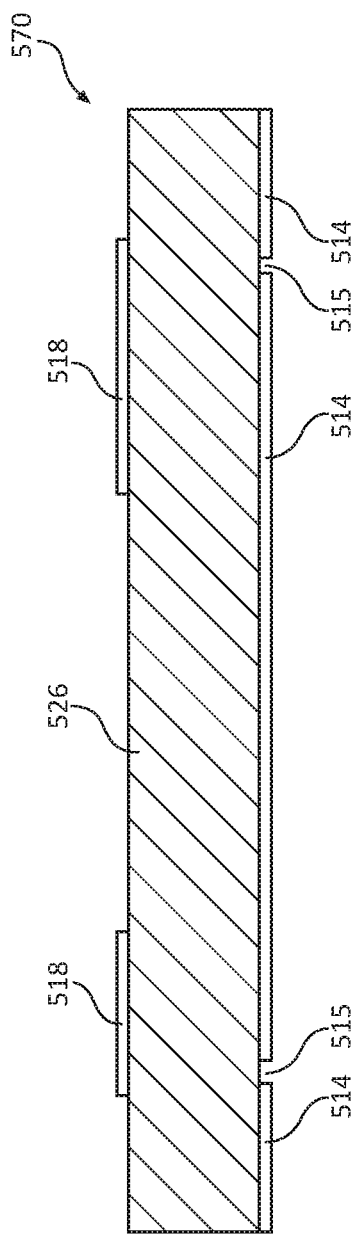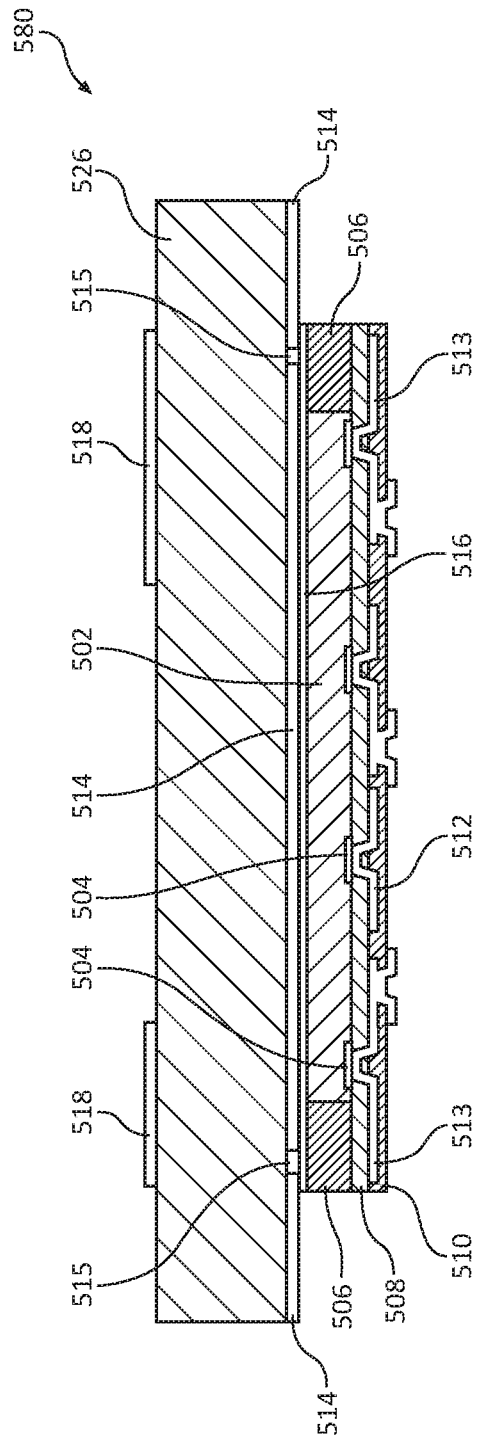

SEMICONDUCTOR DEVICE INCLUDING AN ANTENNA

BACKGROUND

One type of semiconductor device package is an embedded wafer level ball grid array (eWLB) package. An eWLB package provides a fan-out area to provide more space for interconnect routing compared to semiconductor device packages without a fan-out area. For millimeter wave applications, antennas are used to transmit and receive radio frequency (RF) signals. The antennas may be integrated on a printed circuit board on which an RF semiconductor chip is attached. Integrating antennas on a printed circuit board may be expensive.

For these and other reasons, there is a need for the present invention.

SUMMARY

One example of a semiconductor device includes a semiconductor chip and a redistribution layer on a first side of the semiconductor chip. The redistribution layer is electrically coupled to the semiconductor chip. The semiconductor device includes a dielectric layer and an antenna on the dielectric layer. The dielectric layer is between the antenna and the semiconductor chip.

BRIEF DESCRIPTION OF THE DRAWINGS

FIG. 3A is a cross-sectional view illustrating another example of a semiconductor device.

FIG. 3B is a cross-sectional view illustrating another example of a semiconductor device.

FIGS. 6A-6D are cross-sectional views illustrating one example of a method for fabricating the semiconductor device illustrated in FIG. 5.

DETAILED DESCRIPTION

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As used herein, the term "electrically coupled" is not meant to mean that the elements must be directly coupled together and intervening elements may be provided between the "electrically coupled" elements. "Electrically coupled" elements have a metallic or other electrically conductive material path between the "electrically coupled" elements such that a current may flow from one element to the other element.

As used herein, "electromagnetically coupled" elements are coupled through an electromagnetic field without a metallic or other electrically conductive material path between the "electromagnetically coupled" elements such that a current cannot flow from one element to the other element.

Figure 1A:
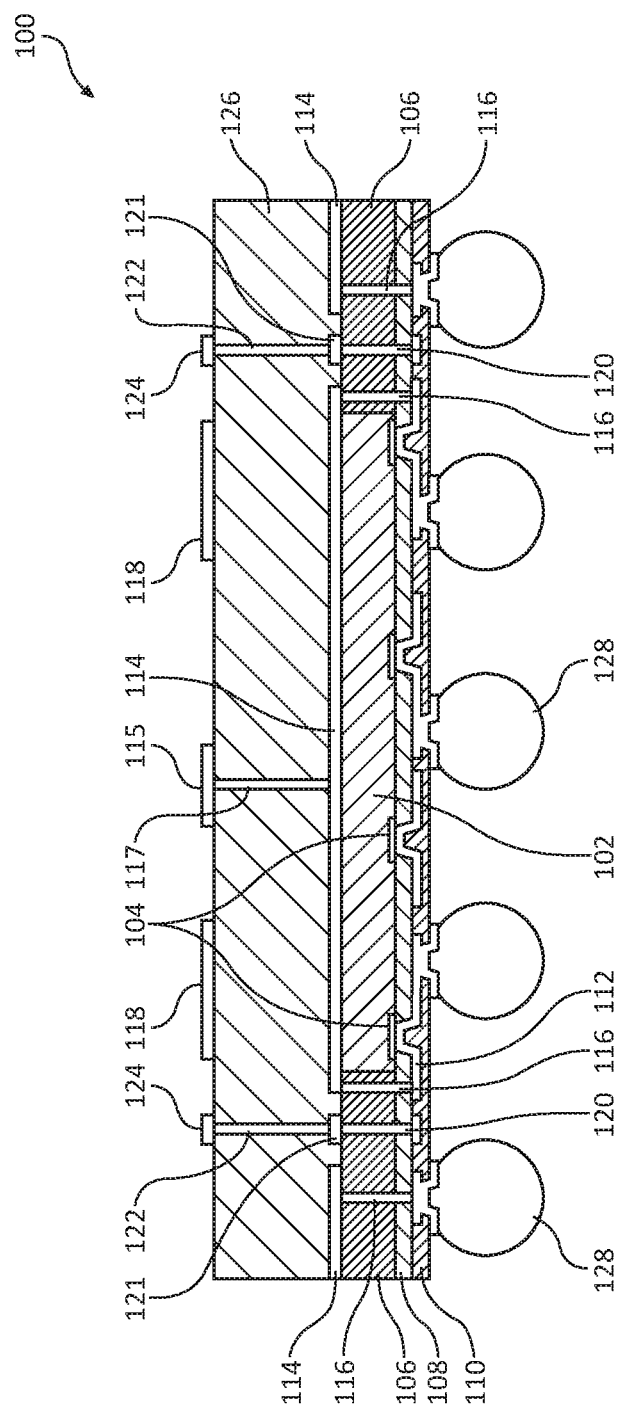
FIG. 1A is a cross-sectional view and FIG. 1B is a top view illustrating of one example of a semiconductor device.
Figure 1B:
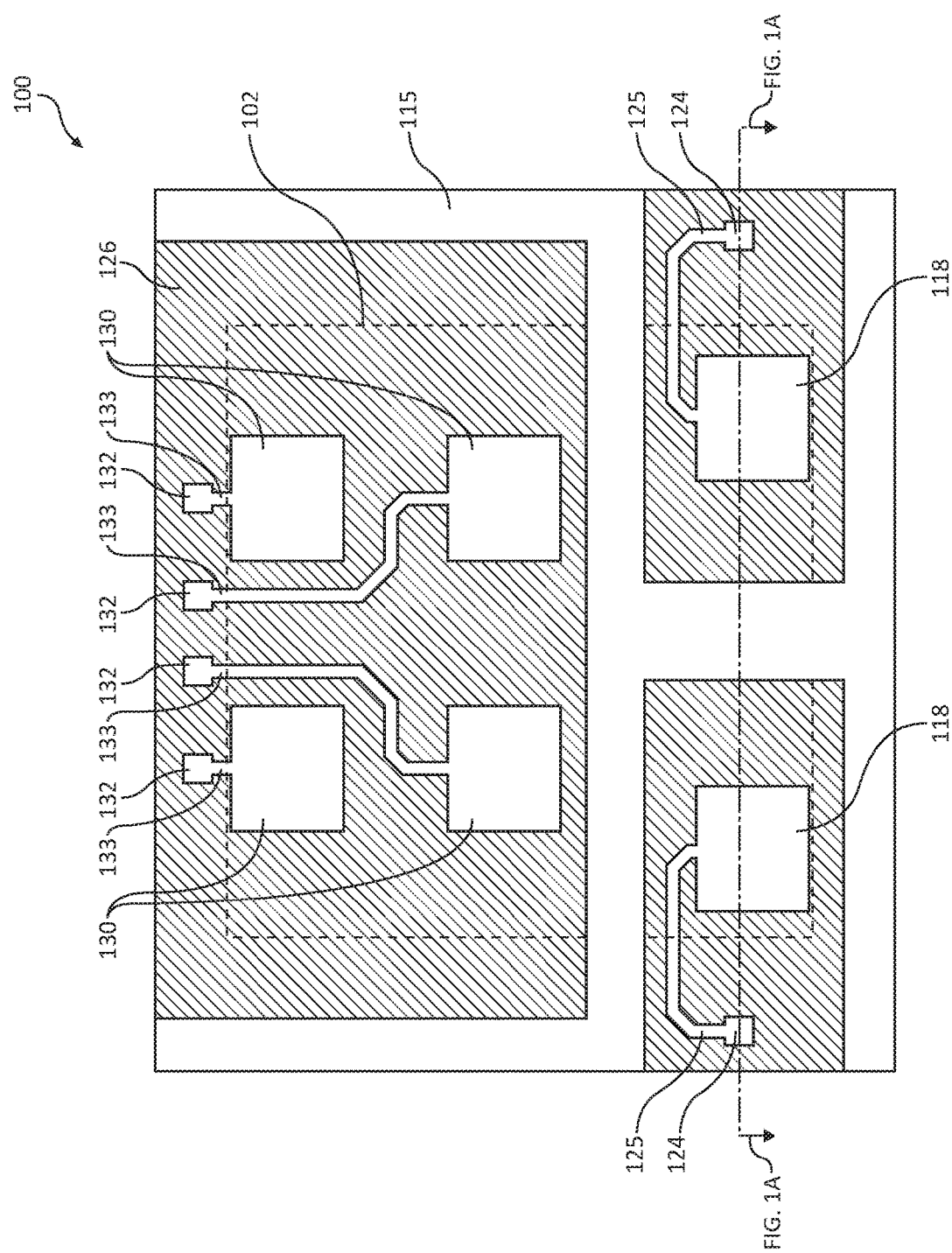

FIG. 1A is a cross-sectional view and FIG. 1B is a top view illustrating one example of a semiconductor device 100. Semiconductor device 100 is an embedded wafer level ball grid array (eWLB) semiconductor device. Semiconductor device 100 includes a semiconductor chip 102, an encapsulant material 106 (e.g., a mold compound, a polymer, an epoxy, BT, or a hydrocarbon/ceramic laminate), a redistribution layer 112, a conductive layer 114 (e.g., ground plane, reflector, or shielding), dielectric layers 108, 110, and 126, patch antennas 118 for transmitting RF signals, patch antennas 130 for receiving RF signals, and solder balls 128. In one example, semiconductor chip 102 is a radio frequency (RF) semiconductor chip for a millimeter wave application, such as gesture sensing at 60 GHz or another suitable application.

A front side (i.e., active side) of semiconductor chip 102 includes contacts 104. Contacts 104 may be composed of Cu, Al, Au, Ag, W, and/or another suitable metal. Semiconductor chip 102 is laterally surrounded by encapsulant material 106, such as a mold compound or another suitable encapsulation material, which provides a fan-out area for electrical connections to semiconductor chip 102. The top surface of dielectric layer 108 contacts the bottom surface of encapsulant material 106 and the front side of semiconductor chip 102. The bottom surface of dielectric layer 108 contacts the top surface of dielectric layer 110. In one example, each dielectric layer 108 and 110 may be composed of $SiO_2$, $Si_3N_4$, or another suitable dielectric material. Redistribution layer 112 is formed on and/or within dielectric layers 108 and 110. Redistribution layer 112 may be composed of Cu, Al, Au, Ag, W, and/or other suitable metals. Redistribution layer 112 electrically couples contacts 104 to conductive layer 114, solder balls 128, and patch antennas 118 and 130.

The bottom surface of conductive layer 114 contacts the back side of semiconductor chip 102 and the top surface of encapsulant material 106. In one example, conductive layer 114 covers semiconductor chip 102 and encapsulant material 106 except where electrical connections to patch antennas 118 and 130 extend through conductive layer 114. Conductive layer 114 is electrically coupled to redistribution layer 112 through vias 116, which extend through encapsulant material 106. Conductive layer 114 and vias 116 may be composed of Cu, Al, Au, Ag, W, and/or other suitable metals.

The bottom surface of dielectric layer 126 contacts the top surface of conductive layer 114. In one example, dielectric layer 126 may be composed of a laminate, an encapsulant material, an imide material, or another suitable dielectric material. A ground line 115 and patch antennas 118 and 130 contact the top surface of dielectric layer 126. Ground line 115 is electrically coupled to conductive layer 114 through vias 117 (one via 117 is visible in FIG. 1A), which extend through dielectric layer 126. Each patch antenna 118 is electrically coupled to redistribution layer 112 through a via 120, which extends through encapsulant material 106, a conductive pad 121 on the top surface of encapsulant material 106, a via 122, which extends through dielectric layer 126, and a conductive pad 124 and conductive trace 125 on the top surface of dielectric layer 126. Each patch antenna 130 is electrically coupled to redistribution layer 112 through a via through encapsulant material 106 (not shown), a conductive pad on the top surface of encapsulant material 106 (not shown), a via through dielectric layer 126 (not shown), and a conductive pad 132 and a conductive trace 133 on the top surface of dielectric layer 126. In one example, vias 120 and 122, conductive pads 121, 124, and 132, conductive traces 125 and 133, and patch antennas 118 and 130 may be composed of Cu, Al, Au, Ag, W, and/or other suitable metals. Each via 116, 120, and 122 may be rectangular in shape with dimensions (length by width by height) between 50 μm by 10 μm by 50 μm and 150 μm by 10 μm by 450 μm. Each via 116, 120, and 122 may be formed using a photolithography, etching, and deposition process; a laser drilling and deposition process; or another suitable process.

As shown in FIG. 1B, patch antennas 118 and 130 are within the footprint of semiconductor chip 102. Patch antennas 118 for transmitting RF signals include two patch antennas separated by ground line 115. Each patch antenna 118 is arranged at a corner of semiconductor chip 102. Patch antennas 130 for receiving RF signals include four patch antennas arranged in a square configuration. Patch antennas 130 are separated from patch antennas 118 by ground line 115. In other examples, patch antennas 118 and 130 may have another suitable arrangement. By arranging patch antennas 118 and 130 above semiconductor chip 102, a compact semiconductor device 100 including integrated RF functionally may be provided. In this way, an application board on which semiconductor device 100 is installed does not require antennas to implement RF functionality.

Figure 7A:
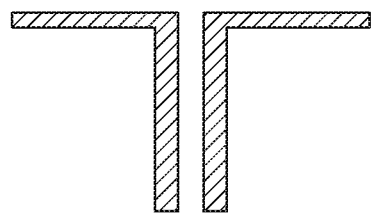
FIGS. 7A-7F illustrate example antenna structures.
Figure 7B:
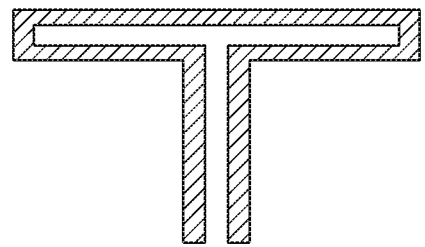
Figure 7C:
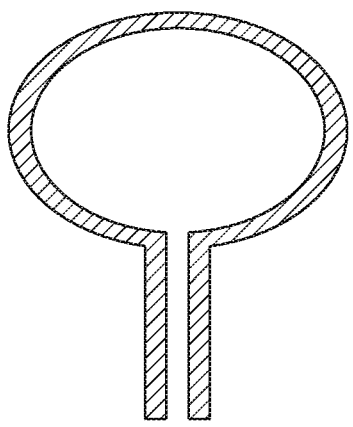
Figure 7D:
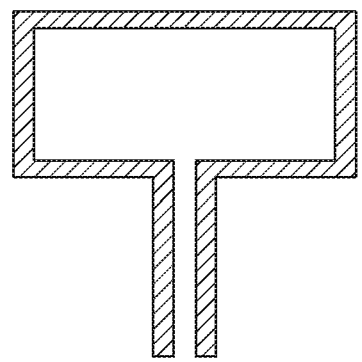
Figure 7E:
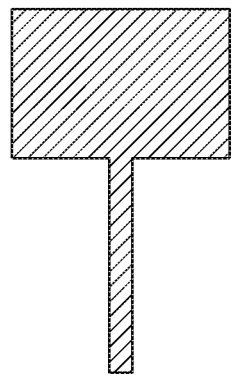
Figure 7F:
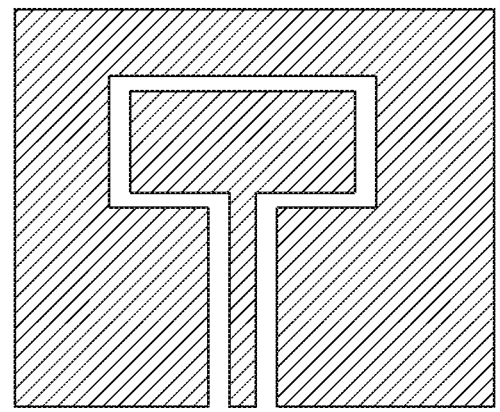

In other examples, any one of various types of planar antennas may be used in place of patch antennas 118 and 130. For example, antennas 118 and 130 may include dipole antennas (FIG. 7A), folded dipole antennas (FIG. 7B), ring antennas (FIG. 7C), rectangular loop antennas (FIG. 7D), coplanar patch antennas (FIG. 7F), slot antennas, or monopole antennas.

Figure 2A:
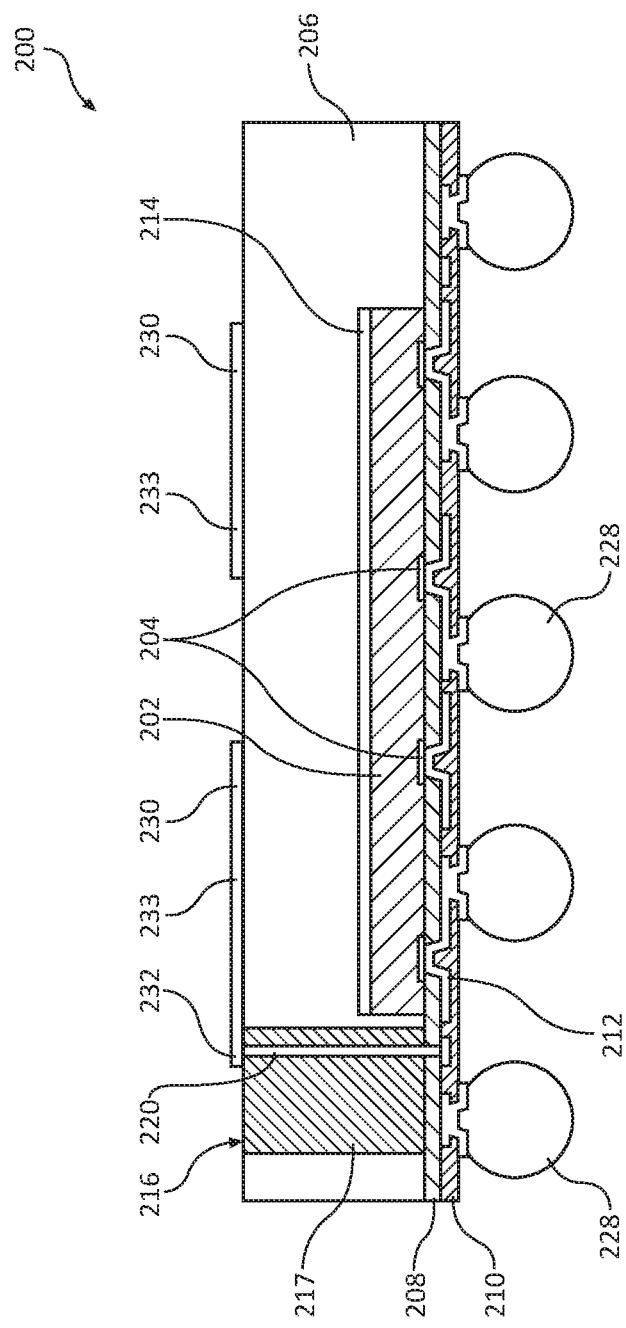
FIG. 2A is a cross-sectional view and FIG. 2B is a top view illustrating another example of a semiconductor device.
Figure 2B:
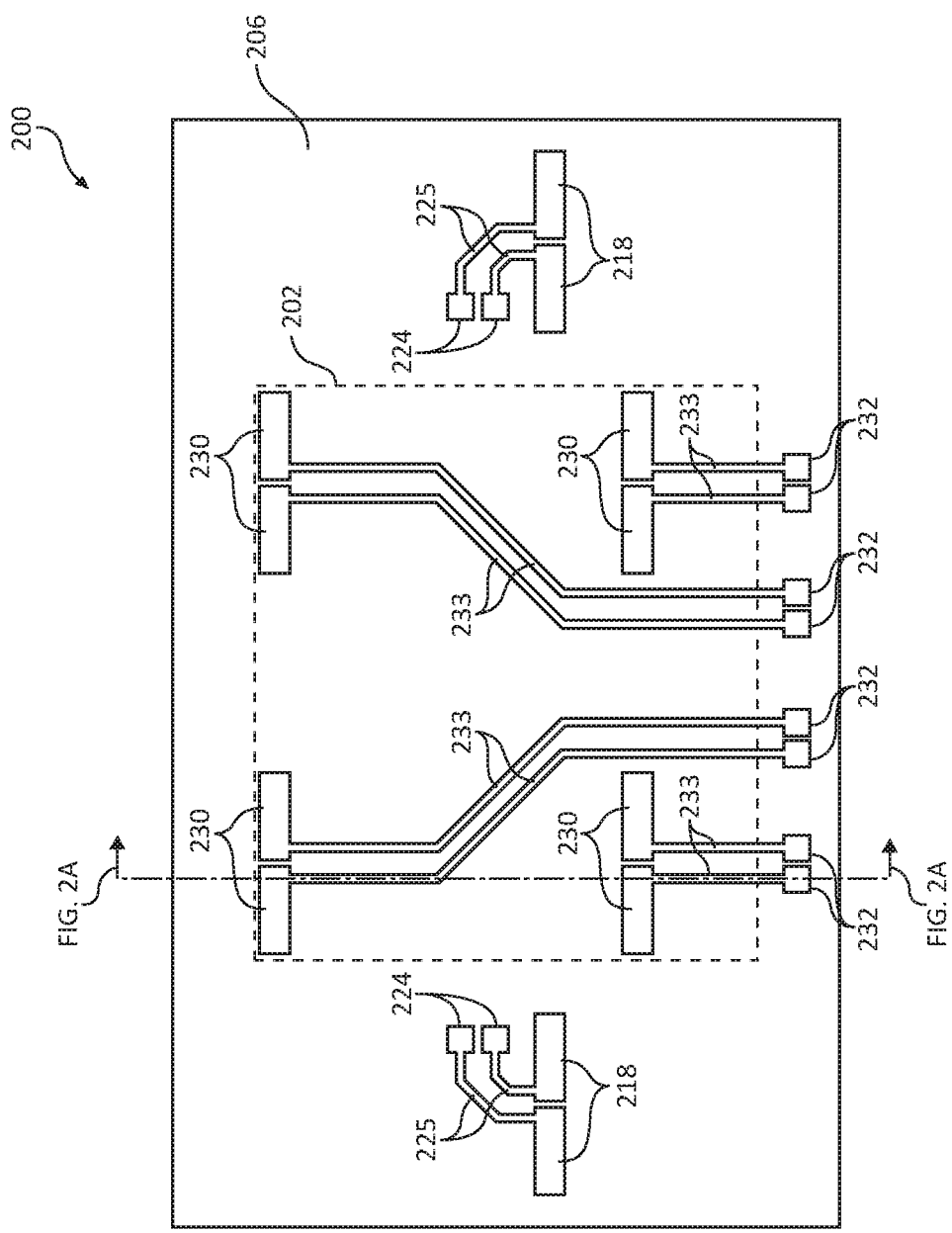

FIG. 2A is a cross-sectional view and FIG. 2B is a top view illustrating another example of a semiconductor device 200. Semiconductor device 200 is an eWLB semiconductor device. Semiconductor device 200 includes a semiconductor chip 202, an encapsulant material 206, a redistribution layer 212, a conductive layer 214 (e.g., reflector, ground plane, or shielding), dielectric layers 108 and 110, dipole antennas 218 for transmitting RF signals, dipole antennas 230 for receiving RF signals, and solder balls 228. In one example, semiconductor chip 202 is a RF semiconductor chip for a millimeter wave application, such as gesture sensing at 60 GHz or another suitable application.

A front side (i.e., active side) of semiconductor chip 202 includes contacts 204. Contacts 204 may be composed of Cu, Al, Au, Ag, W, and/or another suitable metal. Semiconductor chip 202 is laterally surrounded by encapsulant material 206, such as a mold compound or another suitable encapsulation material, which provides a fan-out area for electrical connections to semiconductor chip 202. The top surface of dielectric layer 208 contacts a bottom surface of encapsulant material 206 and the front side of semiconductor chip 202. The bottom surface of dielectric layer 208 contacts the top surface of dielectric layer 210. In one example, each dielectric layer 208 and 210 may be composed of $SiO_2$, $Si_3N_4$, or another suitable dielectric material. Redistribution layer 212 is formed on and/or within dielectric layers 208 and 210. Redistribution layer 212 may be composed of Cu, Al, Au, Ag, W, and/or other suitable metals. Redistribution layer 212 electrically couples contacts 204 to solder balls 226 and to dipole antennas 218 and 230.

In one example, the bottom surface of conductive layer 214 contacts the back side of semiconductor chip 202. Conductive layer 214 may be low ohmic (e.g., less than 1 Ohm) contacted to the bulk silicon of semiconductor chip 202 and thereby grounded. In another example, conductive layer 214 is isolated from semiconductor chip 202 via another material. In one example, conductive layer 214 covers semiconductor chip 202. Conductive layer 214 may be composed of Cu, Al, Au, Ag, W, and/or another suitable metal. In one example, redistribution layer 212 includes conductive layer portions (not shown) in the fan-out area of encapsulant material 206. Encapsulant material 206 contacts the top surface of conductive layer 214. Dipole antennas 218 and 230 contact the top surface of encapsulant material 206.

Each dipole antenna 230 is electrically coupled to redistribution layer 212 through differential transmission lines including a via connection 216 and conductive pads 232 and conductive traces 233 on the top surface of via connection 216 and the top surface of encapsulant material 206. Each dipole antenna 218 is electrically coupled to redistribution layer 212 through differential transmission lines including a via connection (not shown) and conductive pads 224 and conductive traces 225 on the top surface of encapsulant material 206. In one example, conductive pads 224 and 232, conductive traces 225 and 233, and dipole antennas 218 and 230 may be composed of Cu, Al, Au, Ag, W, and/or other suitable metals.

In one example, via connection 216 is an embedded Z-line (EZL) via connection. EZL via connection 216 is fabricated using eWLB lateral X-Y structures that serve as vertical Z structures after sawing and flipping the structures 90°. Via connection 216 includes a dielectric material 217 in which vias 220 are formed. When fabricating semiconductor device 200, via connection 216 is embedded in encapsulant material 206. Via connection 216 is then exposed by grinding encapsulant material 206 to provide the top surface of encapsulant material 206 as illustrated in FIG. 2A.

As shown in FIG. 2B, dipole antennas 218 are outside the footprint of semiconductor chip 202 and dipole antennas 230 are within the footprint of semiconductor chip 202. Dipole antennas 218 for transmitting RF signals include two dipole antennas on opposing sides of semiconductor chip 202. Dipole antennas 230 for receiving RF signals include four dipole antennas arranged in a square configuration. In other examples, dipole antennas 218 and 230 may have another suitable arrangement. By arranging dipole antennas 230 above semiconductor chip 202 and dipole antennas 218 above the fan-out area, a compact semiconductor device 200 including integrated RF functionally may be provided. In this way, an application board on which semiconductor device 200 is installed does not require antennas to implement RF functionality.

In other examples, any one of various types of planar antennas may be used in place of dipole antennas 218 and 230. For example, antennas 218 and 230 may include folded dipole antennas (FIG. 7B), ring antennas (FIG. 7C), rectangular loop antennas (FIG. 7D), patch antennas (FIG. 7E), coplanar patch antennas (FIG. 7F), slot antennas, or monopole antennas.

FIG. 3A is a cross-sectional view illustrating another example of a semiconductor device 300. Semiconductor device 300 is an eWLB semiconductor device. Semiconductor device 300 includes a semiconductor chip 302, an encapsulant material 306, a redistribution layer 312 including a conductive layer 314 (e.g., ground plane, reflector, or shielding), dielectric layers 308, 309, 310, and 326, patch antennas 118 for transmitting RF signals, patch antennas (not shown) for receiving RF signals, a heat sink 327, and solder balls 328. In one example, semiconductor chip 302 is a RF semiconductor chip for a millimeter wave application, such as gesture sensing at 60 GHz or another suitable application.

A front side (i.e., active side) of semiconductor chip 302 includes contacts 304. Contacts 304 may be composed of Cu, Al, Au, Ag, W, and/or another suitable metal. Semiconductor chip 302 is laterally surrounded by encapsulant material 306, such as a mold compound or another suitable encapsulation material, which provides a fan-out area for electrical connections to semiconductor chip 302. The bottom surface of dielectric layer 308 contacts the top surface of encapsulant material 306 and the front side of semiconductor chip 302. The top surface of dielectric layer 308 contacts the bottom surface of dielectric layer 310. In one example, each dielectric layer 308 and 310 may be composed of $SiO_2$, $Si_3N_4$, or another suitable dielectric material. Redistribution layer 312 is formed on and/or within dielectric layers 308 and 310. Redistribution layer 312 may be composed of Cu, Al, Au, Ag, W, and/or other suitable metals. Redistribution layer 312 electrically couples contacts 304 to solder balls 328 through vias 316, which extend through encapsulant material 306, provides RF signal feeds 313, and provides conductive layer 314.

The top surface of dielectric layer 309 contacts the back side of semiconductor chip 302 and the bottom surface of encapsulant material 306. Dielectric layer 309 may be composed of the same dielectric material as dielectric layer 308 or 310. The top surface of heat sink 327 contacts the bottom surface of dielectric layer 309. Heat sink 327 may be electrically coupled to conductive layer 314 through redistribution layer 312 and vias (not shown), which extend through encapsulant material 306. Heat sink 327 may be composed of Cu, Al, Au, Ag, W, and/or another suitable metal.

The bottom surface of conductive layer 314 contacts the top surface of dielectric layer 310. In one example, conductive layer 314 covers semiconductor chip 302 and encapsulant material 306 except where slots 315 are arranged. The top surface of conductive layer 314 contacts the bottom surface of dielectric layer 326. In one example, dielectric layer 326 may be composed of a laminate, an encapsulant material, an imide material, or another suitable dielectric material. Patch antennas 318 contact the top surface of dielectric layer 326. Patch antennas 318 are aligned with slots 315 of conductive layer 314 to provide aperture coupled patch antennas 318 to RF signal feeds 313. By using aperture coupled patch antennas, an electrical connection between semiconductor chip 302 and patch antennas 318 is not required. Rather, patch antennas 318 are electromagnetically coupled to semiconductor chip 302 through slots 315 in conductive layer 314. Patch antennas 118 may be composed of Cu, Al, Au, Ag, W, and/or another suitable metal.

FIG. 3B is a cross-sectional view illustrating another example of a semiconductor device 350. Semiconductor device 350 is similar to semiconductor device 300 previously described and illustrated with reference to FIG. 3A, except that in semiconductor device 350, conductive layer 314 is removed. In this example, patch antennas 318 are proximity coupled to RF signal feeds 313. By using proximity coupled patch antennas, an electrical connection between semiconductor chip 302 and patch antennas 318 is not required. Rather, patch antennas 318 are electromagnetically coupled to semiconductor chip 302.

Figure 4:
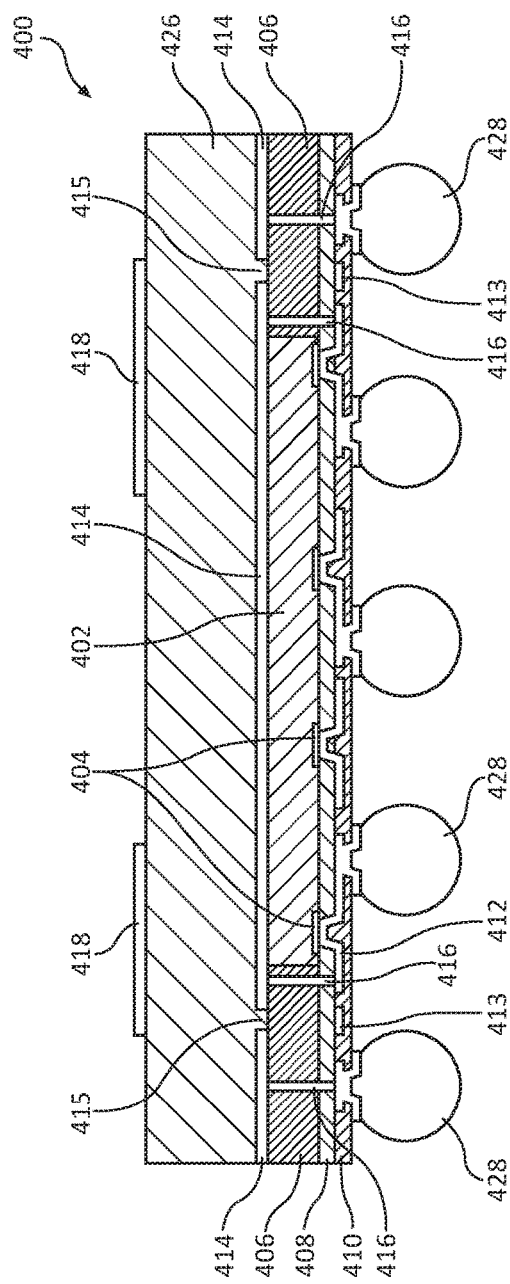
FIG. 4 is a cross-sectional view illustrating another example of a semiconductor device.

FIG. 4 is a cross-sectional view illustrating another example of a semiconductor device 400. Semiconductor device 400 is an eWLB semiconductor device. Semiconductor device 400 includes a semiconductor chip 402, an encapsulant material 406, a redistribution layer 412, a conductive layer 414 (e.g., ground plane, reflector, or shielding), dielectric layers 408, 410, and 426, patch antennas 418 for transmitting RF signals, patch antennas (not shown) for receiving RF signals, and solder balls 428. In one example, semiconductor chip 402 is a RF semiconductor chip for a millimeter wave application, such as gesture sensing at 60 GHz or another suitable application.

A front side (i.e., active side) of semiconductor chip 402 includes contacts 404. Contacts 404 may be composed of Cu, Al, Au, Ag, W, and/or another suitable metal. Semiconductor chip 402 is laterally surrounded by encapsulant material 406, such as a mold compound or another suitable encapsulation material, which provides a fan-out area for electrical connections to semiconductor chip 402. The top surface of dielectric layer 408 contacts the bottom surface of encapsulant material 406 and the front side of semiconductor chip 402. The bottom surface of dielectric layer 408 contacts the top surface of dielectric layer 410. In one example, each dielectric layer 408 and 410 may be composed $SiO_2$, $Si_3N_4$, or another suitable dielectric material. Redistribution layer 412 is formed on and/or within dielectric layers 408 and 410. Redistribution layer 412 may be composed of Cu, Al, Au, Ag, W, and/or other suitable metals. Redistribution layer 412 electrically couples contacts 404 to conductive layer 414 and solder balls 428 and provides RF signal feeds 413.

The bottom surface of conductive layer 414 contacts the back side of semiconductor chip 402 and the top surface of encapsulant material 406. Conductive layer 414 is electrically coupled to redistribution layer 412 through vias 416, which extend through encapsulant material 406. Conductive layer 414 and vias 416 may be composed of Cu, Al, Au, Ag, W, and/or other suitable metals. In one example, conductive layer 414 covers semiconductor chip 402 and encapsulant material 406 except where slots 415 are arranged. The top surface of conductive layer 414 contacts the bottom surface of dielectric layer 426. In one example, dielectric layer 426 may be composed of a laminate, an encapsulant material, an imide material, or another suitable dielectric material. Patch antennas 418 contact the top surface of dielectric layer 426. Patch antennas 418 are aligned with slots 415 of conductive layer 414 to provide aperture coupled patch antennas 418 to RF signal feeds 413. By using aperture coupled patch antennas, an electrical connection between semiconductor chip 402 and patch antennas 418 is not required. Rather, patch antennas 418 are electromagnetically coupled to semiconductor chip 402 through slots 415 in conductive layer 414. In other examples, patch antennas 418 may be proximity coupled antennas (not shown), which are electromagnetically coupled to semiconductor chip 402. Patch antennas 418 may be composed of Cu, Al, Au, Ag, W, and/or another suitable metal.

Figure 5:
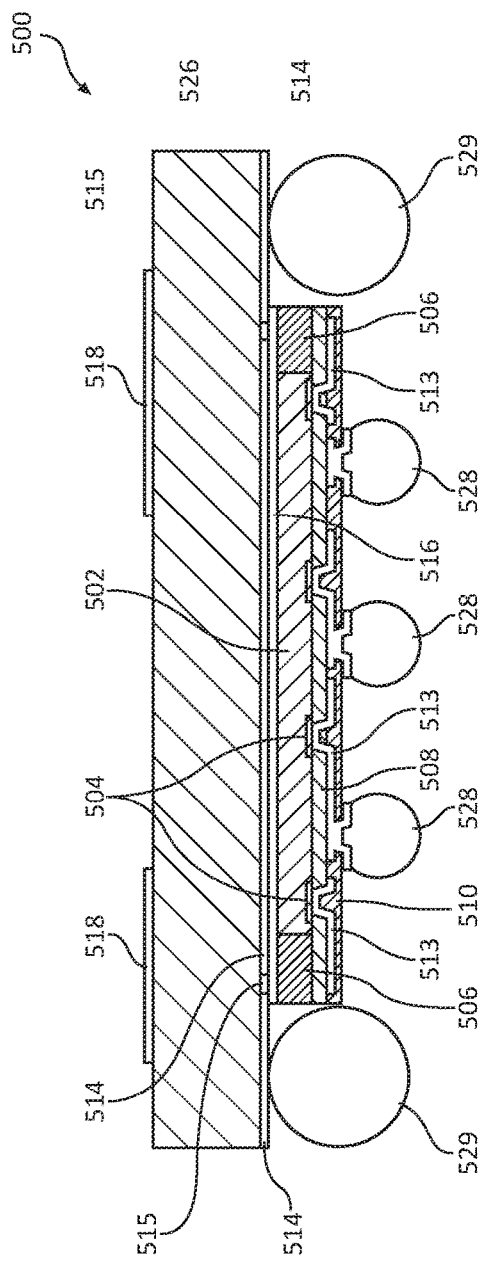
FIG. 5 is a cross-sectional view illustrating another example of a semiconductor device.

FIG. 5 is a cross-sectional view illustrating another example of a semiconductor device 500. Semiconductor device 500 is an eWLB semiconductor device. Semiconductor device 500 includes a semiconductor chip 502, an encapsulant material 506, a redistribution layer 512, a conductive layer 514 (e.g., ground plane, reflector, or shielding), dielectric layers 508, 510, and 526, patch antennas 518 for transmitting RF signals, patch antennas (not shown) for receiving RF signals, a die attach foil 516, and solder balls 528 and 529. In one example, semiconductor chip 502 is a RF semiconductor chip for a millimeter wave application, such as gesture sensing at 60 GHz or another suitable application.

A front side (i.e., active side) of semiconductor chip 502 includes contacts 504. Contacts 504 may be composed of Cu, Al, Au, Ag, W, and/or another suitable metal. Semiconductor chip 502 is laterally surrounded by encapsulant material 506, such as a mold compound or another suitable encapsulation material, which provides a fan-out area for electrical connections to semiconductor chip 502. The top surface of dielectric layer 508 contacts the bottom surface of encapsulant material 506 and the front side of semiconductor chip 502. The bottom surface of dielectric layer 508 contacts the top surface of dielectric layer 510. In one example, each dielectric layer 508 and 510 may be composed of $SiO_2$, $Si_3N_4$, or another suitable dielectric material. Redistribution layer 512 is formed on and/or within dielectric layers 508 and 510. Redistribution layer 512 may be composed of Cu, Al, Au, Ag, W, and/or other suitable metals. Redistribution layer 512 electrically couples contacts 504 to solder balls 528 and provides RF signal feeds 513.

The bottom surface of die attach foil 516 contacts the back side of semiconductor chip 502 and the top surface of encapsulant material 506. The top surface of die attach foil 516 contacts the bottom surface of conductive layer 514. Conductive layer 514 is electrically coupled to solder balls 529, which are laterally adjacent to semiconductor chip 502 and encapsulant material 506 and which are larger than solder balls 528. Solder balls 529 have a diameter greater than a sum of the thicknesses of semiconductor chip 502 and redistribution layer 512. By using solder balls 529, vias to electrically couple conductive layer 514 to redistribution layer 512 are not needed. Conductive layer 514 may be composed of Cu, Al, Au, Ag, W, and/or another suitable metal. In one example, conductive layer 514 covers semiconductor chip 502 and encapsulant material 506 except where slots 515 are arranged. The top surface of conductive layer 514 contacts the bottom surface of dielectric layer 526.

In one example, dielectric layer 526 may be composed of a laminate, an encapsulant material, an imide material, or another suitable dielectric material. Patch antennas 518 contact the top surface of dielectric layer 526. Patch antennas 518 are aligned with slots 515 of conductive layer 514 to provide aperture coupled patch antennas 518 to RF signal feeds 513. By using aperture coupled patch antennas, an electrical connection between semiconductor chip 502 and patch antennas 518 is not required. Rather, patch antennas 518 are electromagnetically coupled to semiconductor chip 502 through slots 515 in conductive layer 514. In other examples, patch antennas 518 may be proximity coupled antennas (not shown), which are electromagnetically coupled to semiconductor chip 502. Patch antennas 518 may be composed of Cu, Al, Au, Ag, W, and/or another suitable metal.

FIGS. 6A-6D are cross-sectional views illustrating one example of a method for fabricating semiconductor device 500 illustrated in FIG. 5. FIG. 6A is a cross-sectional view illustrating one example of a semiconductor device 550 after a first stage of the fabrication process. Semiconductor device 550 is one semiconductor device in an eWLB wafer. Semiconductor device 550 includes a semiconductor chip 502, a redistribution layer 512, dielectric layers 508 and 510, and an encapsulant material 506. Encapsulant material 506 covers the back side of semiconductor chip 502 and laterally surrounds semiconductor chip 502 to provide a fan-out area for electrical connections. Kerfs 552 are cut through dielectric layers 510 and 508 and into encapsulant material 506 prior to dicing and grinding the eWLB wafer to provide a plurality of separated semiconductor devices.

FIG. 6B is a cross-sectional view illustrating one example of a semiconductor device 560 after a second stage of the fabrication process. The back side of semiconductor device 550 illustrated in FIG. 6A is subjected to grinding to remove encapsulant material 506 to expose the back side of semiconductor chip 502 and to singulate the eWLB wafer to provide semiconductor device 560 having an eWLB package.

FIG. 6C is a cross-sectional view illustrating one example of a carrier 570. Carrier 570 includes a dielectric layer 526, a conductive layer 514, patch antennas 518 for transmitting RF signals, and patch antennas (not shown) for receiving RF signals. Conductive layer 514 is formed on a first side of dielectric layer 526 via a plating process, a deposition process, or anther suitable process. Conductive layer 514 includes slots 515. Patch antennas 518 are formed on a second side of dielectric layer 526 opposite to the first side via a plating process, a deposition process, or another suitable process. Each patch antenna 518 is aligned with a slot 515 of conductive layer 514.

FIG. 6D is a cross-sectional view illustrating one example of a semiconductor device 580 after attaching carrier 570 previously described and illustrated with reference to FIG. 6C to semiconductor device 560 previously described and illustrated with reference to FIG. 6B. Carrier 570 is attached to the back side of semiconductor chip 502 and to encapsulant material 506 via a die attach foil 516. In other examples, carrier 570 is attached to the back side of semiconductor chip 502 and to encapsulant material 506 using an adhesive material or another suitable die attach material. Solder balls 528 are then electrically coupled to redistribution layer 512 and solder balls 529 are electrically coupled to conductive layer 514 to provide semiconductor device 500 previously described and illustrated with reference to FIG. 5.

The semiconductor devices described herein including antennas in an eWLB package enable the use of less expensive application boards rather than more expensive RF application boards. In addition, by arranging at least a portion of the antennas above the RF semiconductor chip, the package size and thus the cost of the semiconductor devices is reduced. Further, the eWLB package provides excellent RF performance due to low parasitic inductance and ohmic losses.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A semiconductor device comprising:
a semiconductor chip;
an encapsulant material laterally surrounding the semiconductor chip;
a redistribution layer on a first side of the semiconductor chip, the redistribution layer electrically coupled to the semiconductor chip;
a dielectric layer;
a conductive layer between the dielectric layer and the semiconductor chip, wherein a bottom surface of the conductive layer directly contacts a second side of the semiconductor chip and a top surface of the encapsulant material, wherein a bottom surface of the dielectric layer contacts a top surface of the conductive layer, wherein only the conductive layer is between the second side of the semiconductor chip and the bottom surface of the dielectric layer;
an antenna on the dielectric layer, the antenna including a plurality of receiving antennas and a plurality of transmitting antennas, wherein the plurality of receiving antennas and the plurality of transmitting antennas are disposed only within a footprint of the semiconductor chip and not outside the footprint of the semiconductor chip; and
a ground line on the dielectric layer electrically coupled to the conductive layer through a via extending through the dielectric layer,
wherein the dielectric layer is between the antenna and the semiconductor chip.

2. The semiconductor device of claim 1, further comprising:
a plurality of solder balls electrically coupled to the redistribution layer.

3. The semiconductor device of claim 1, wherein the conductive layer is electrically coupled to the redistribution layer.

4. The semiconductor device of claim 1, wherein the antenna is electrically coupled to the semiconductor chip.

5. The semiconductor device of claim 1, wherein the antenna comprises a dipole antenna, a folded dipole antenna, a ring antenna, a rectangular loop antenna, a patch antenna, or a coplanar patch antenna.

6. The semiconductor device of claim 1,
wherein the redistribution layer is on the first side of the semiconductor chip and the encapsulant material, and
wherein the dielectric layer is on the second side of the semiconductor chip opposite to the first side.

7. The semiconductor device of claim 6, wherein the semiconductor chip is electrically coupled to the antenna through the redistribution layer, a first via through the encapsulant material, and a second via through the dielectric layer.

8. The semiconductor device of claim 1, wherein the conductive layer is electrically coupled to the redistribution layer through a via through an encapsulant material.

9. The semiconductor device of claim 1, wherein the semiconductor chip is electrically coupled to the antenna through the redistribution layer and a via connection through the dielectric layer.

10. The semiconductor device of claim 1, wherein the antenna comprises a dipole antenna, a folded dipole antenna, a ring antenna, a rectangular loop antenna, a patch antenna, or a coplanar patch antenna.

11. The semiconductor device of claim 1, wherein the ground line separates the transmitting antennas from the receiving antennas.

12. The semiconductor device of claim 11, wherein the ground line separates each transmitting antenna from one another.

* * * * *